(12) United States Patent
Chudzik et al.

(10) Patent No.: US 9,627,508 B2
(45) Date of Patent: Apr. 18, 2017

(54) REPLACEMENT CHANNEL TFET

(71) Applicant: GLOBALFOUNDRIES INC., Grand Cayman (KY)

(72) Inventors: Michael P. Chudzik, Sunnyvale, CA (US); Siddarth A. Krishnan, Peekskill, NY (US); Unoh Kwon, Fishkill, NY (US); Vijay Narayanan, New York, NY (US); Jeffrey W. Sleight, Ridgefield, CT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/685,944

(22) Filed: Apr. 14, 2015

(65) Prior Publication Data

US 2016/0308025 A1 Oct. 20, 2016

(51) Int. Cl.
| H01L 29/78 | (2006.01) |
| H01L 29/66 | (2006.01) |
| H01L 29/88 | (2006.01) |
| H01L 29/20 | (2006.01) |
| H01L 21/02 | (2006.01) |
| H01L 29/739 | (2006.01) |
| H01L 29/267 | (2006.01) |

(52) U.S. Cl.
CPC .. *H01L 29/66545* (2013.01); *H01L 21/02538* (2013.01); *H01L 21/02617* (2013.01); *H01L 29/20* (2013.01); *H01L 29/267* (2013.01); *H01L 29/6656* (2013.01); *H01L 29/66151* (2013.01); *H01L 29/66356* (2013.01); *H01L 29/66795* (2013.01); *H01L 29/7391* (2013.01); *H01L 29/785* (2013.01); *H01L 29/88* (2013.01)

(58) Field of Classification Search
CPC ......... H01L 27/0886; H01L 21/823431; H01L 21/823821; H01L 21/845; H01L 27/0924; H01L 27/1211; H01L 29/41791; H01L 29/66795; H01L 29/785; H01L 29/66151; H01L 29/88; H01L 29/7311; H01L 29/66545; H01L 29/7851; H01L 29/0657; H01L 29/7391; H01L 29/66356
See application file for complete search history.

(56) References Cited

U.S. PATENT DOCUMENTS

| 8,362,561 | B2 | 1/2013 | Nuttinck et al. |
| 8,384,122 | B1 | 2/2013 | Hu et al. |
| 8,404,545 | B2 | 3/2013 | Vandenberghe et al. |
| 8,638,591 | B2 | 1/2014 | Saripalli et al. |
| 8,669,163 | B2 | 3/2014 | Bhuwalka et al. |

(Continued)

FOREIGN PATENT DOCUMENTS

| CN | 104425606 A | * | 3/2015 | |
| WO | WO 2012152762 A1 | * | 11/2012 | ....... H01L 29/66356 |

*Primary Examiner* — Olik Chaudhuri
*Assistant Examiner* — Pauline Vu
(74) *Attorney, Agent, or Firm* — Hoffman Warnick LLC (57) ABSTRACT

A semiconductor structure includes a substrate and an intrinsic replacement channel. A tunneling field effect transistor (TFET) fin may be formed by the intrinsic replacement channel, a p-fin and an n-fin formed upon the substrate. The p-fin may serve as the source of the TFET and the n-fin may serve as the drain of the TFET. The replacement channel may be formed in place of a sacrificial channel of a diode fin that includes the p-fin, the n-fin, and the sacrificial channel at the p-fin and n-fin junction.

20 Claims, 8 Drawing Sheets (56) References Cited

U.S. PATENT DOCUMENTS

| | | |
|---|---|---|
| 8,772,877 B2 | 7/2014 | Bjoerk et al. |
| 8,878,234 B2 | 11/2014 | Gossner et al. |
| 2007/0040221 A1* | 2/2007 | Gossner .............. H01L 27/0288 257/355 |
| 2007/0158703 A1* | 7/2007 | Mathew .............. H01L 27/0811 257/288 |
| 2009/0026553 A1* | 1/2009 | Bhuwalka ......... H01L 29/66356 257/402 |
| 2009/0101975 A1* | 4/2009 | Holz ............... H01L 21/823418 257/347 |
| 2010/0038713 A1* | 2/2010 | Majhi ................. H01L 21/2652 257/344 |
| 2010/0140589 A1* | 6/2010 | Ionescu ................. B82Y 10/00 257/24 |
| 2011/0147838 A1* | 6/2011 | Gossner ............ H01L 29/66356 257/345 |
| 2013/0119395 A1* | 5/2013 | Bhuwalka ........... H01L 29/7391 257/76 |
| 2013/0193512 A1* | 8/2013 | Weis ................... H01L 27/0207 257/337 |
| 2013/0221407 A1* | 8/2013 | Hou ...................... H01L 29/785 257/192 |
| 2013/0320427 A1* | 12/2013 | Loh .................... H01L 29/7391 257/327 |
| 2014/0131765 A1* | 5/2014 | Tsai .................... H01L 27/0255 257/133 |
| 2014/0138744 A1* | 5/2014 | Kotlyar ................. H01L 29/785 257/192 |
| 2014/0175381 A1* | 6/2014 | Goh ................. H01L 29/66545 257/39 |
| 2014/0252407 A1 | 9/2014 | Anghel et al. |
| 2015/0179800 A1* | 6/2015 | Biswas ................ H01L 29/7855 365/189.011 |
| 2015/0206958 A1* | 7/2015 | Walke ............... H01L 29/66356 257/105 |
| 2015/0340489 A1* | 11/2015 | Xiao .................... H01L 29/785 257/105 |
| 2016/0071965 A1* | 3/2016 | Afzalian ............... H01L 29/165 257/12 |

\* cited by examiner

REPLACEMENT CHANNEL TFET

FIELD

Embodiments of invention generally relate to semiconductor devices and semiconductor device fabrication methods. More particularly, embodiments relate to semiconductor structures including a tunneling field effect transistor (TFET) fabricated with a replacement channel.

BACKGROUND

Transistors are semiconductor devices that are commonly found in a wide variety of integrated circuits. When a voltage is applied to a gate of the transistor that is greater than a threshold voltage, the transistor is turned on, and current may flow through the transistor. When the voltage at the gate is less than the threshold voltage, the transistor is off, and current does not flow through the transistor.

One type of transistor is a TFET. TFETs switch from off to on by modulating tunneling through a barrier. Source and drain terminals of a TFET are doped of opposite type. A common TFET device structure consists of a P-I-N (p-type, intrinsic, n-type) junction, in which the electrostatic potential of the intrinsic region is controlled by a gate terminal.

The TFET is operated by applying gate bias so that electron accumulation occurs in the intrinsic region. At sufficient gate bias, band-to-band tunneling occurs when the conduction band of the intrinsic region aligns with the valence band of the P region. Electrons from the valence band of the p-type region tunnel into the conduction band of the intrinsic region and current can flow across the device. As the gate bias is reduced, the bands become misaligned and current can no longer flow.

SUMMARY

In an embodiment of the present invention, a semiconductor device fabrication process includes forming a diode fin upon a semiconductor substrate, the diode fin including a p-fin, an n-fin, and sacrificial channel at the p-fin and n-fin junction, forming a sacrificial gate upon the diode fin overlaying the sacrificial channel, removing the sacrificial gate to expose the sacrificial channel, removing the sacrificial channel to expose the substrate beneath the sacrificial channel, the removal of the sacrificial channel forming a p-fin sidewall and an opposing n-fin sidewall, and, forming an intrinsic replacement channel in place of the removed sacrificial channel.

In another embodiment of the present invention, a semiconductor device includes a tunneling field effect transistor (TFET) fin upon a semiconductor substrate, the TFET fin comprising a p-fin, an intrinsic replacement channel, and a n-fin, and a replacement gate upon the TFET fin overlaying the intrinsic replacement channel.

In another embodiment of the present invention, a semiconductor device fabrication process includes providing a bulk semiconductor substrate, epitaxially growing a fin layer from an upper surface of the semiconductor substrate, p-doping a portion of the fin layer and n-doping an adjacent portion of the fin layer, forming a diode fin by removing sections of the p-doped portion and removing sections of the p-doped portion, the diode fin comprising a p-fin, an n-fin, and a sacrificial channel at the p-fin and n-fin junction, and forming a tunneling field effect transistor (TFET) fin by removing the sacrificial channel and forming an intrinsic replacement channel in place of the removed sacrificial channel.

These and other embodiments, features, aspects, and advantages will become better understood with reference to the following description, appended claims, and accompanying drawings.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

The drawings are not necessarily to scale. The drawings are merely schematic representations, not intended to portray specific parameters of the invention. The drawings are intended to depict only exemplary embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. These exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

Referring to the drawings, wherein like components are labeled with like numerals, exemplary fabrication steps of forming a semiconductor structure 10 in accordance with embodiments of the present invention are shown, and will now be described in greater detail below. It should be noted that the drawings may depict cross section views of structure 10 along n-fin 30 and p-fin 40 center plane AA or may depict cross section views of structure 10 along non n-fin 30 and p-fin 40 plane BB. Furthermore, it should be noted that while this description may refer to some components of the structure 10 in the singular tense, more than one component may be included within the semiconductor device. The specific number of components depicted in the drawings and the cross section orientation was chosen to best illustrate the various embodiments described herein.

Figure 1A:
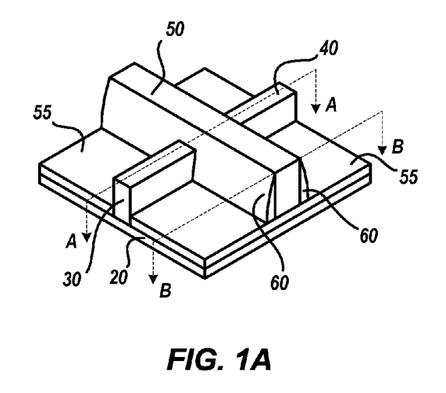
FIG. 1A depicts an isometric view and FIG. 1B depicts a cross section view of a semiconductor structure, in accordance with various embodiments of the present invention.
Figure 1B:
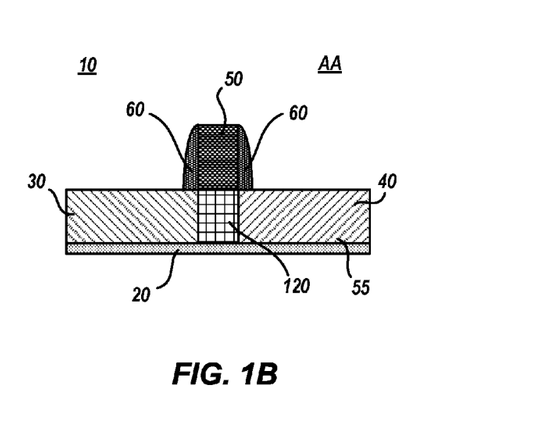

As shown in FIG. 1A and/or in FIG. 1B, a semiconductor structure 10 includes a replacement channel 120. Structure 10 may further include a p-fin 30 and an n-fin 40 formed in or upon a substrate 20. The p-fin 30 may serve as the source of structure 10 and the n-fin 40 may serve as the drain of structure 10. Structure 10 may also include shallow trench isolation (STI) regions 55 that electrically isolate p-fins 30 and electrically isolate n-fins 40. As is further described herein, structure 10 may be fabricated by forming a sacrificial gate upon STI regions 55 and upon a sacrificial channel. The sacrificial gate and the sacrificial channel are removed and the replacement channel 120 may be formed in the place of the removed sacrificial channel. Replacement gate 60 may be formed upon the STI regions and upon the replacement channel 120 in place of the sacrificial gate. In other words, the semiconductor device with replacement channel 120 may be formed utilizing gate last processes.

Figure 2A:
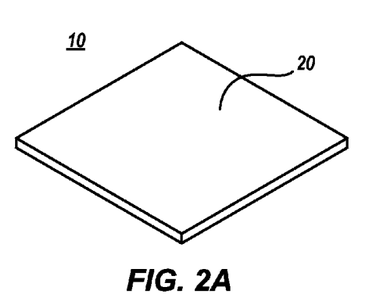
FIG. 2A depicts an isometric view and FIG. 2B depicts a cross section view of a semiconductor structure at an intermediate stage of semiconductor device fabrication, in accordance with various embodiments of the present invention.
Figure 2B:
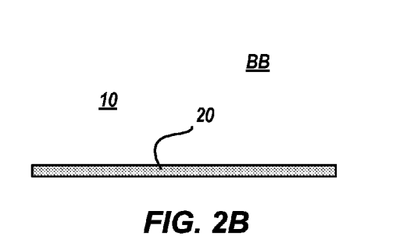

FIG. 2A depicts an isometric view and FIG. 2B depicts a cross section view along plane BB of semiconductor structure 10 at intermediate stages of semiconductor device fabrication, in accordance with various embodiments of the present invention. At this stage of fabrication, structure 10 includes a semiconductor substrate 20.

Substrate 20 is a bulk semiconductor substrate. Bulk semiconductor substrate 20 material may be, e.g., an undoped Si substrate, Ge substrate, SiGe substrate, III-V substrate, etc. The upper surface of substrate 20 is a <100> lattice plane from which epitaxial growth may occur. In embodiments, substrate 20 may be a bulk wafer. Substrate 20 may have a thickness ranging from about 100 um to about 10000 um.

Figures 3A, 3B:
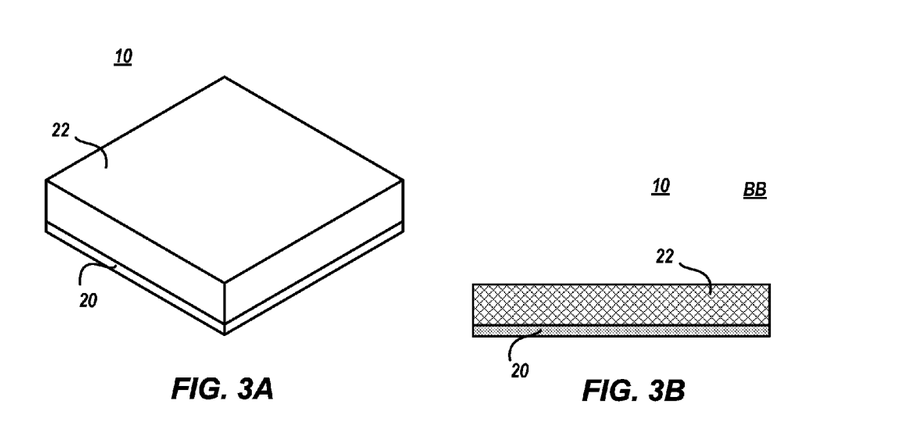
FIG. 3A depicts an isometric view and FIG. 3B depicts a cross section view of a semiconductor structure at an intermediate stage of semiconductor device fabrication, in accordance with various embodiments of the present invention.

FIG. 3A depicts an isometric view and FIG. 3B depicts a cross section view along plane BB of semiconductor structure 10 at intermediate stages of semiconductor device fabrication, in accordance with various embodiments of the present invention. At this stage of fabrication, fin layer 22 is formed upon semiconductor substrate 20.

Fin layer 22 may be deposited upon substrate 20 utilizing conventional techniques such as chemical vapor deposition (CVD), atomic layer deposition (ALD). Preferably, fin layer 22 may be grown from the upper surface <100> lattice place of substrate 20.

Epitaxial growth, grown, deposition, formation, etc. means the growth of a semiconductor material on a deposition surface of a semiconductor material, in which the semiconductor material being grown has the same crystalline characteristics as the semiconductor material of the deposition surface. In an epitaxial growth process, the chemical reactants provided by the source gasses are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a <100> lattice place will take on a <100> orientation.

Examples of various epitaxial growth process apparatuses that are suitable for use in forming epitaxial semiconductor material of the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition process for forming the epitaxial semiconductor material typically ranges from 450° C. to 950° C. Although higher temperature typically results in faster deposition, the faster deposition may result in crystal defects, film cracking, etc. In this regard, fin layer 22 may be grown to a thickness where such crystal defects, film cracking, etc. formations begin. For example, fin layer 22 may be grown to a thickness ranging from 10 nm to 10 um.

A non limiting list of exemplary epitaxial materials are: silicon germanium alloy (SiGe), Silicon (Si), in-situ doped SiGe or Si, undoped or doped III-V semiconductors with doping concentrations ranging from $1 \times 10^{19}$ cm$^{-3}$ to $1.5 \times 10^{21}$ cm$^{-3}$.

The material of substrate 20 may itself serve as the seed surface for the epitaxial growth of the material of fin layer 22. The epitaxy growth may be carried out in a selective manner, meaning that the epitaxial growth may occur only over exposed semiconductor surfaces, for instance over an n-region of structure 10 while other surfaces (e.g. p-region, etc.) of structure 10 stay essentially free of the epitaxy material. For example, a p-doped fin layer 22 portion 32 (shown in FIG. 4A, 4B) may be epitaxially grown in the p-region of structure 10 and an n-doped fin layer 22 portion 42 (shown in FIG. 4A, 4B) may be epitaxially grown in the n-region of structure 10. Such doping may be performed during the epitaxial growth, in so called in-situ doping schemes, as known in the art. Both p-type and n-type dopants are well known in the art, and any of them may be used in the embodiments of the present disclosure for doping respective portions of fin layer 22. In other embodiments, fin layer 22 is formed without dopants.

Unless otherwise indicated, fin layer 22 may be formed by other known processes without deviating from the spirit of those embodiments herein claimed.

Figures 4A, 4B:
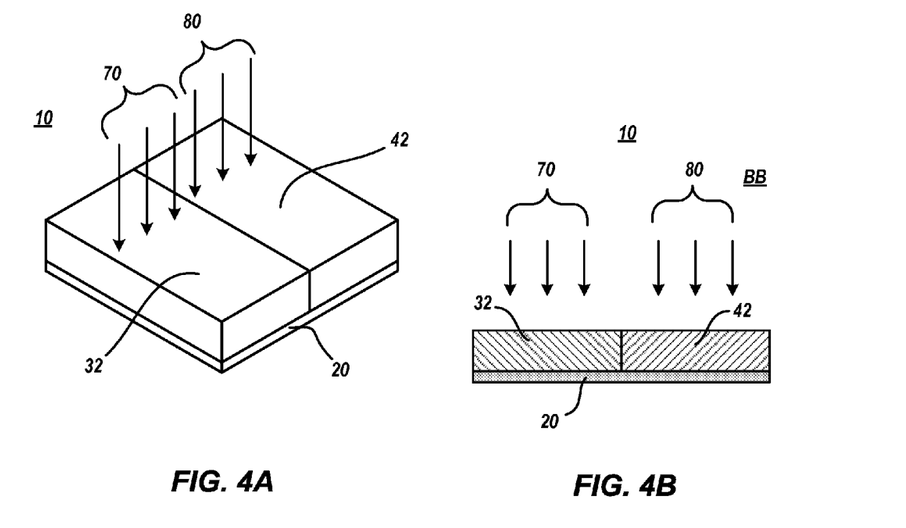
FIG. 4A depicts an isometric view and FIG. 4B depicts a cross section view of a semiconductor structure at an intermediate stage of semiconductor device fabrication, in accordance with various embodiments of the present invention.

FIG. 4A depicts an isometric view and FIG. 4B depicts a cross section view along plane BB of semiconductor structure 10 at intermediate stages of semiconductor device fabrication, in accordance with various embodiments of the present invention. At this stage of fabrication, n-doped portion 42 and p-doped portion 32 are formed in fin layer 22 by ion implant processes 70 or ion implant processes 80, respectively. This stage of fabrication may be completed, e.g., when fin layer 22 is deposited or formed without dopants.

Ion implant processes 70 generally implant p-type dopants into portion 32 of fin layer 22. Ion implant processes 80 generally implant n-type dopants into portion 42 of fin layer 22. Both p-type and n-type ion implant processes are known in the art. Such processes may utilize a mask layer (not shown) to protect portions 32, 42 during dopant introduction into the opposing portion. The mask layer can be formed using process steps such as, without limitation: material deposition or formation; photolithography; imaging; etching; and cleaning. For instance, a soft mask or a hard mask can be formed overlying portion 42 to serve as a mask while p-type dopants are introduced into portion 32. Unless otherwise indicated, doped portion 32 and doped portion 42 of fin layer 22 may be formed by other known processes without deviating from the spirted of those embodiments herein claimed.

Figure 5A:
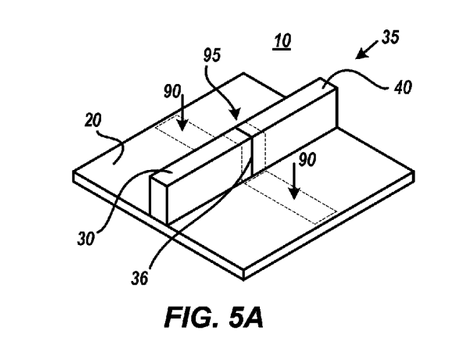
FIG. 5A depicts an isometric view and FIG. 5B depicts a cross section view of a semiconductor structure at an intermediate stage of semiconductor device fabrication, in accordance with various embodiments of the present invention.
Figure 5B:
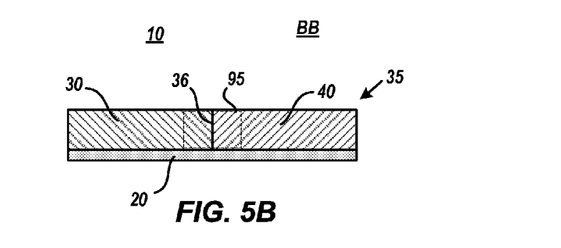

FIG. 5A depicts an isometric view and FIG. 5B depicts a cross section view along plane BB of semiconductor structure 10 at intermediate stages of semiconductor device fabrication, in accordance with various embodiments of the present invention. At this stage of fabrication, diode fin 35 and sacrificial channel 90 are formed upon structure 10.

Diode fin 35 includes p-fin 30 aligned with n-fin 40. P-fin 30 is joined to n-fin 40 at junction 36. Sacrificial channel 95 is p-fin 30 material and n-fin material 40 centered upon and surrounding junction 36. Diode fin 35 may be formed by subtractive etching processes. Such processes may utilize a mask (not shown) to protect a masked portion 32 and to protect a masked portion 42 from an etchant utilized to remove non-masked portion 32 and to remove non-masked portion 42. The mask can be formed using process steps such as, without limitation: material deposition or formation; photolithography; imaging; etching; and cleaning. For instance, a soft mask or a hard mask can be formed overlying the area(s) of TFET fins 35 to serve as the mask while non-masked material is removed by the etchant. The etchant(s) may be chosen to selectively remove the material of portion 32 and remove the material of portion 42 while the material of substrate 20 is retained. The masked portion 32 and portion 42 that is retained generally form TFET 35. Unless otherwise indicated, diode fin 35 and/or sacrificial channel 95 may be formed by other known processes without deviating from the spirted of those embodiments herein claimed.

In embodiments, structure 10 may undergo isolation implant processes 90 to isolate p-region of substrate 20 from n-region of substrate 90. P-region of substrate 20 is generally associated with p-fin 30 and n-region of substrate 20 is generally associated with n-fin 40. Isolation implant processes are known in the art. Such isolation implant processes may utilize a mask layer (not shown) to protect substrate 20 during the isolation implantation into an unmasked isolation region of substrate 20 that separates the p-region of substrate 20 from n-region of substrate 90.

Figures 6A, 6B:
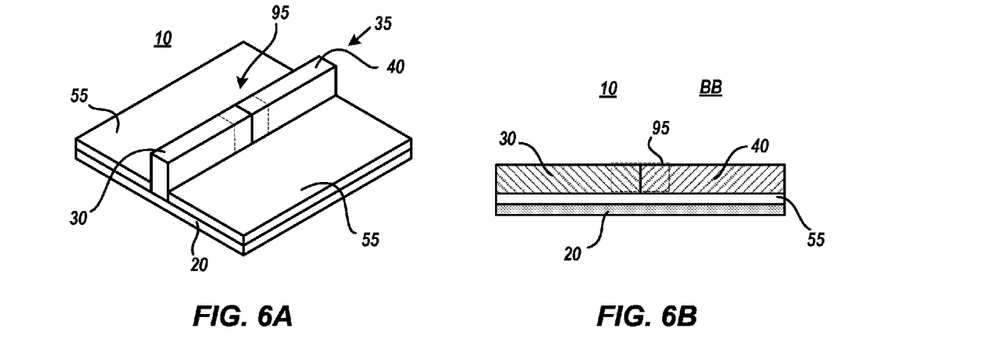
FIG. 6A depicts an isometric view and FIG. 6B depicts a cross section view of a semiconductor structure at an intermediate stage of semiconductor device fabrication, in accordance with various embodiments of the present invention.

FIG. 6A depicts an isometric view and FIG. 6B depicts a cross section view along plane BB of semiconductor structure 10 at intermediate stages of semiconductor device fabrication, in accordance with various embodiments of the present invention. At this stage of fabrication, STI region 55 is formed upon structure 10.

STI regions 55 may be deposited upon upper surface of substrate 15 adjacent to and upon diode fin 35 sidewalls. STI regions 55 electrically isolate neighboring p-fins 30 and electrically isolate neighboring n-fins 40. STI regions 55 further electrically isolate gate 60 from substrate 20. STI regions 55 may be a dielectric material, such as oxide, etc. STI regions may be deposited to a thickness similar to the thickness of fin layer 22 and may subsequently be recessed to obtain to the desired active fin height (ranging from e.g., 20-50 nm, etc.). Unless otherwise indicated, STI regions 55 may be formed by other known processes without deviating from the spirted of those embodiments herein claimed.

Figure 7A:
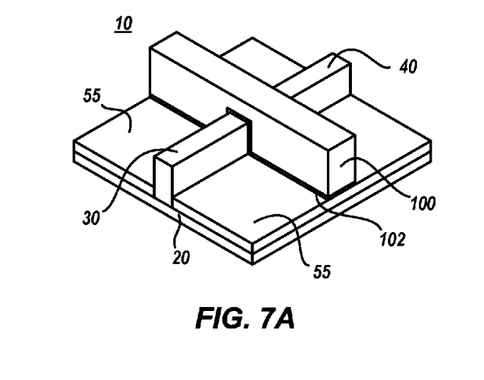
FIG. 7A depicts an isometric view and FIG. 7B depicts a cross section view of a semiconductor structure at an intermediate stage of semiconductor device fabrication, in accordance with various embodiments of the present invention.
Figure 7B:
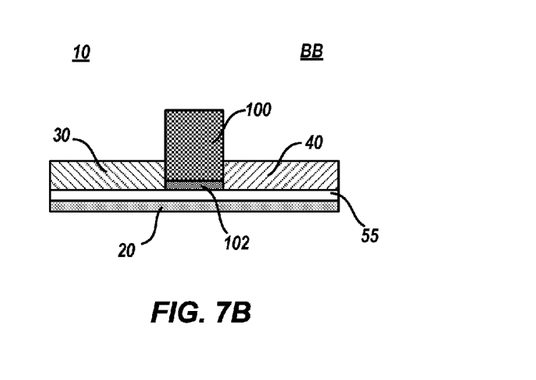

FIG. 7A depicts an isometric view and FIG. 7B depicts a cross section view along plane BB of semiconductor structure 10 at intermediate stages of semiconductor device fabrication, in accordance with various embodiments of the present invention. At this stage of fabrication sacrificial gate 100 is formed upon structure 10.

Sacrificial gate 100 may be formed upon STI regions 55 by depositing a gate dielectric layer 102 upon upper surface of STI regions 55 orthogonal to diode fin 35 and upon diode fin 35 surrounding sacrificial channel 95. Sacrificial gate 100 may be deposited upon gate dielectric layer 102. In embodiments, gate dielectric layer 102 is optional as sacrificial gate 100 may be deposited directly upon upper surface of STI regions 55 orthogonal to diode fin 35 and upon diode fin 35 surrounding sacrificial channel 95.

Gate dielectric layer 102 may be, e.g., a silicon oxide, a silicon oxynitride, poly silicon, Al2O3, AlON, etc. In one embodiment, the gate dielectric layer 102 can be formed by CVD, atomic layer deposition (ALD), etc. The gate dielectric layer 102 may have a thickness ranging from about 1 nm to about 10 nm, although a thickness less than 1 nm and greater than 10 nm have been contemplated. In one embodiment, the gate dielectric layer 102 may be about 5 nm thick. In some embodiments, the gate dielectric layer 102 may be sacrificial and replaced in subsequent operations.

Sacrificial gate 100 may be formed by depositing sacrificial gate material upon gate dielectric layer 102 or directly upon STI regions 55 and surrounding diode fin 35. In various embodiments, sacrificial gate material may be a poly or nitride. In certain embodiments, sacrificial gate material is an electrically conductive material or any sacrificial material, as the sacrificial gate material is removed during a later processing step. In particular embodiments, sacrificial gate material may be poly silicon deposited by e.g. plasma-enhanced chemical vapor deposition (PECVD). In certain embodiments, the gate dielectric layer 102 may be a dielectric material that can function as an etch stop layer during subsequent removal of e.g. sacrificial gate material. Similarly, sacrificial gate material may be a dielectric or conducting material that can be removed selectively with respect to, dielectric layer 102, STI regions 55, gate spacers 60, exemplarily shown in FIG. 8A, and/or sacrificial channel 95. The thickness of gate material may be from 10 nm to 500 nm, although lesser and greater thicknesses have been contemplated.

In embodiments, sacrificial gate 100 and or gate dielectric layer 102 can be formed using subtractive etching processes. For example, a lithography step may entail applying a photoresist, exposing the photoresist to a pattern of radiation, and developing the pattern utilizing a resist developer. Following the lithography step, an etching process such as reactive-ion etching (RIE) may be employed in transferring the pattern. In certain embodiments, poly, nitride, metal or other gate cap may be formed upon sacrificial gate 100. In certain embodiments this cap may be deposited as a masking layer and utilized as a etch mask (e.g. hard mask, etc.) associated with the formation of sacrificial gate 100 and or gate dielectric layer 102. Using the cap as a mask, an etchant may be used to remove unprotected portions of the gate material outside the footprint, defining the sacrificial gate 100. Subsequent to lithographic and etching processes, a gate stack may be formed that, e.g., includes a retained portion of gate dielectric layer 102 upon STI regions 55, and/or a retained portion of gate material upon the portion of gate dielectric layer 102 (i.e., sacrificial gate 100 as shown in FIG. 8B), and/or a retained portion of mask layer upon the gate material portion (not shown), etc. Unless otherwise indicated, sacrificial gate 100 and/or gate dielectric layer 102 may be formed by other known processes without deviating from the spirted of those embodiments herein claimed.

Figure 8A:
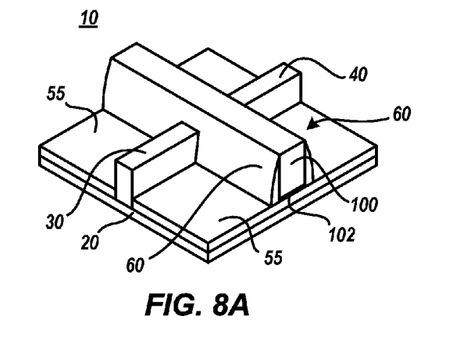
FIG. 8A depicts an isometric view and FIG. 8B depicts a cross section view of a semiconductor structure at an intermediate stage of semiconductor device fabrication, in accordance with various embodiments of the present invention.
Figure 8B:
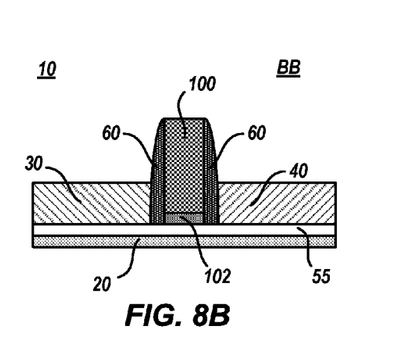

FIG. 8A depicts an isometric view and FIG. 8B depicts a cross section view along plane BB of semiconductor structure 10 at intermediate stages of semiconductor device fabrication, in accordance with various embodiments of the present invention. At this stage of fabrication gate spacers 60 are formed upon structure 10.

Gate spacers 60 may be a dielectric material, such as silicon oxide, silicon nitride, silicon oxynitride, SiBCN, SiOCN or a combination, formed on the sidewalls of the gate stack. The gate spacers 60 may be formed by deposition of a spacer material layer and then etching to remove the material except from the sidewalls of the gate stack. The thickness of the gate spacer 60 may be from 5 nm to 60 nm, and typically from 10 nm to 40 nm, although lesser and greater thicknesses have been contemplated. In certain embodiments, the material of gate spacers 60 is chosen such that sacrificial gate 100, etc. may be removed selectively with respect to gate spacers 60. For instance, if sacrificial gate 100 is poly silicon, gate spacers 60 may be a nitride, etc. Unless otherwise indicated, sacrificial gate 100 and/or gate dielectric layer 102 may be formed by other known processes without deviating from the spirted of those embodiments herein claimed.

Figures 9A, 9B:
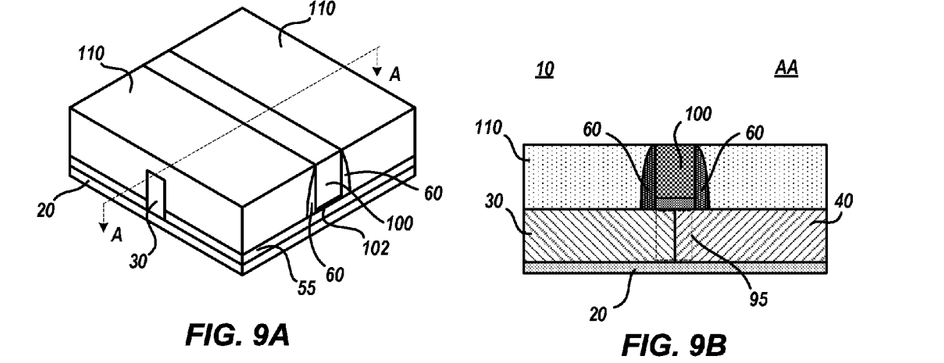
FIG. 9A depicts an isometric view and FIG. 9B depicts a cross section view of a semiconductor structure at an intermediate stage of semiconductor device fabrication, in accordance with various embodiments of the present invention.

FIG. 9A depicts an isometric view and FIG. 9B depicts a cross section view along plane AA of semiconductor structure 10 at intermediate stages of semiconductor device fabrication, in accordance with various embodiments of the present invention. At this stage of fabrication inter layer dielectric (ILD) 110 is deposited upon structure 10. ILD 110 is a dielectric material and is formed to a thickness to cover gate stacks (i.e., an upper surface of ILD 110 is above the upper surface of the gate stack) or to be coplanar with the gate stacks (i.e., upper surface of ILD 110 is coplanar with the upper surface of the gate stack, etc.). If ILD 110 is formed to cover gate stack, a subsequent chemical mechanical polish (CMP) stage may remove excess ILD 110 material above the gate stack. In various embodiments of the present invention, the materials of ILD 110 and material of sacrificial gate 100 are chosen to provide for subsequent selective removal of sacrificial gate 100 relative to ILD 110. Such requirement may be satisfied by different combinations of material selections, e.g, SiO2 based ILDs can be used if amorphous or poly-Si is the sacrificial gate material. Unless otherwise indicated, sacrificial gate 100 and/or gate dielectric layer 102 may be formed by other known processes without deviating from the spirted of those embodiments herein claimed.

Figures 10A, 10B:
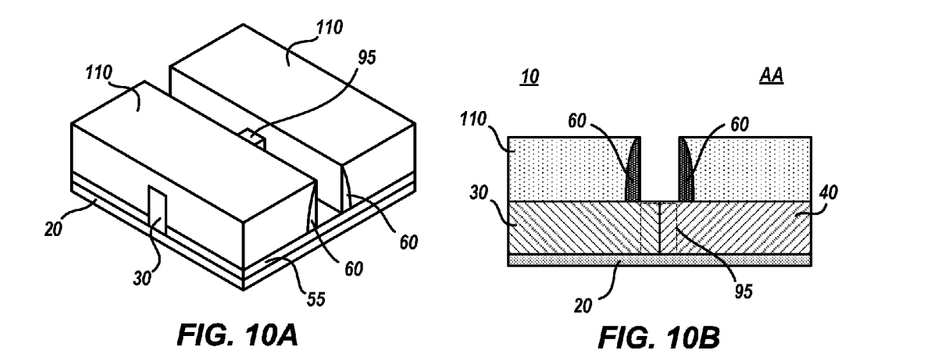
FIG. 10A depicts an isometric view and FIG. 10B depicts a cross section view of a semiconductor structure at an intermediate stage of semiconductor device fabrication, in accordance with various embodiments of the present invention.

FIG. 10A depicts an isometric view and FIG. 10B depicts a cross section view along plane AA of semiconductor structure 10 at intermediate stages of semiconductor device fabrication, in accordance with various embodiments of the present invention. At this stage of fabrication sacrificial channel 95 is exposed upon structure 10. Sacrificial channel 95 may be exposed by subtractive etching processes that selectively remove the sacrificial gate stack while other structure 10 materials remain (e.g., ILD 110, spacers 60, STI region 55, and sacrificial channel 95, etc.). Such processes may utilize a mask (not shown) to protect regions outside of the sacrificial gate stack footprint. For instance, a soft mask or a hard mask can be formed overlying the area(s) of ILD 110 to serve as the mask while the non-masked sacrificial gate stack is removed by the etchant. The etchant(s) may be chosen to selectively remove the material of the gate stack (e.g. gate 100, gate dielectric 102, etc.) while the uncovered materials of spacers 60, sacrificial channel 95, and STI regions 55 are retained. The uncovered sacrificial gate materials are removed generally exposing the sacrificial channel 95. Unless otherwise indicated, sacrificial channel 95 may be exposed by other known processes without deviating from the spirted of those embodiments herein claimed.

Figure 11A:
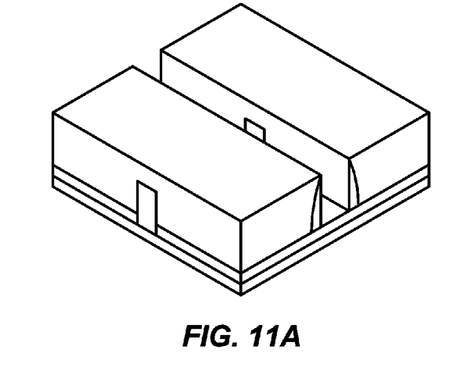
FIG. 11A depicts an isometric view and FIG. 11B depicts a cross section view of a semiconductor structure at an intermediate stage of semiconductor device fabrication, in accordance with various embodiments of the present invention.
Figure 11B:
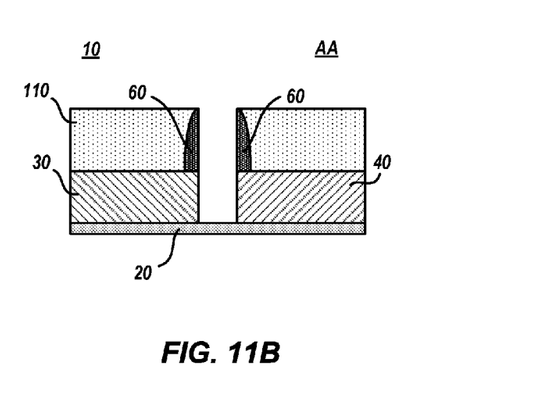

FIG. 11A depicts an isometric view and FIG. 11B depicts a cross section view along plane AA of semiconductor structure 10 at intermediate stages of semiconductor device fabrication, in accordance with various embodiments of the present invention. At this stage of fabrication, sacrificial channel 95 is removed from structure 10. Sacrificial channel 95 may be removed by subtractive etching processes that selectively removes the sacrificial channel 95 while other structure 10 materials remain (e.g., ILD 110, spacers 60, STI region 55, etc.). Such processes may utilize a mask (not shown) to protect regions outside of the sacrificial gate stack footprint. For instance, a soft mask or a hard mask can be formed overlying the area(s) of ILD 110 to serve as the mask while the non-masked sacrificial channel 95 is removed by the etchant. The etchant(s) may be chosen to selectively remove the material of the sacrificial channel 95 while the uncovered materials of spacers 60, STI regions 55, p-fin 30, n-fin 40, and substrate 20 are retained. The uncovered sacrificial channel 95 material(s) are removed by the etchant(s). In an embodiment, multi stage subtractive etching processes may be utilized to separately remove sacrificial gate 100 and sacrificial channel 95. In another embodiment, a single subtractive etching stage may be utilized to remove sacrificial gate 100 and sacrificial channel 95. Unless otherwise indicated, sacrificial channel 95 may be removed by other known processes without deviating from the spirted of those embodiments herein claimed.

Figure 12A:
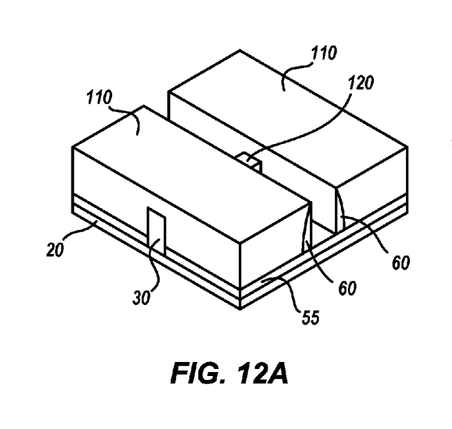
FIG. 12A depicts an isometric view and FIG. 12B depicts a cross section view of a semiconductor structure at an intermediate stage of semiconductor device fabrication, in accordance with various embodiments of the present invention.
Figure 12B:
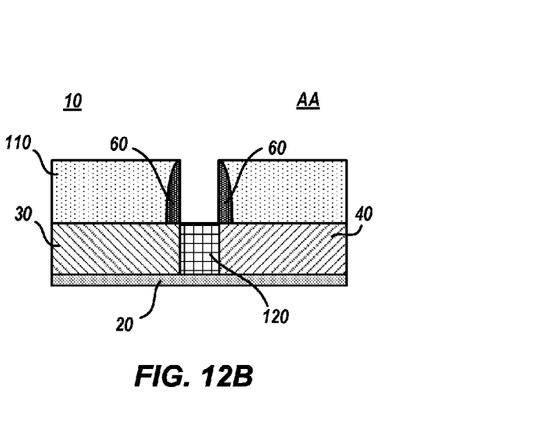

FIG. 12A depicts an isometric view and FIG. 12B depicts a cross section view along plane AA of semiconductor structure 10 at intermediate stages of semiconductor device fabrication, in accordance with various embodiments of the present invention. At this stage of fabrication, replacement channel 120 is formed upon structure 10.

Replacement channel 120 is generally an intrinsic, or undoped, type III-V semiconductor material. The replacement channel 120 is aligned with and contacts both p-fin 30 and n-fin 40 and forms a junction therewith. For example, perimeter surfaces of replacement channel 120 are coplanar with respective perimeter surfaces of p-fin 30 and n-fin 40. In other words, replacement channel 120 is formed to take the place of sacrificial channel 95. The intrinsic channel 120 contacting the-fin 30 and n-fin 40 forms a TFET fin.

In an embodiment, channel 120 may be epitaxially grown from the upper surface <100> lattice plane of substrate 20 that is exposed subsequent to the removal of sacrificial channel 95. The epitaxial growth from substrate 20 may be timed for growth of channel 120 to stop at the upper surface of p-fin 30 or n-fin 40. The epitaxial growth from substrate 20 meets and contacts the exposed sidewall of p-fin 30 and meets and contacts the exposed sidewall of n-fin 40.

In another embodiment, channel may be epitaxially grown from a sidewall surface <101> lattice plane of p-fin 30 or n-fin 40. For example, channel 120 may be grown from the exposed sidewall of p-fin 30 to contact the opposing exposed sidewall of n-fin 40, or vice versa. The epitaxial growth may be timed for growth of channel 120 to stop at the opposing sidewall surface. The expitaxial growth from sidewall surface <101> lattice plane meets and contacts the exposed upper surface of substrate 20 and meets and contacts the exposed sidewall of the opposing fin sidewall. Though p-fin 30 and n-fin 40 are doped materials, channel 120 is epitaxially grown without dopants to form an intrinsic type III-V semiconductor material.

Figure 13A:
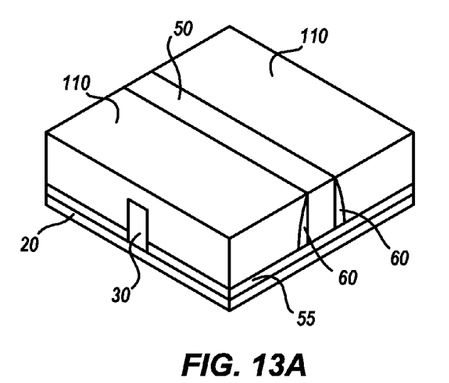
FIG. 13A and FIG. 13C depict isometric views and FIG. 13B depicts a cross section view of a semiconductor structure at an intermediate stage of semiconductor device fabrication, in accordance with various embodiments of the present invention.
Figure 13B:
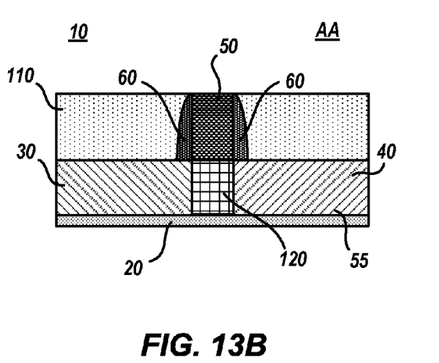
Figure 13C:
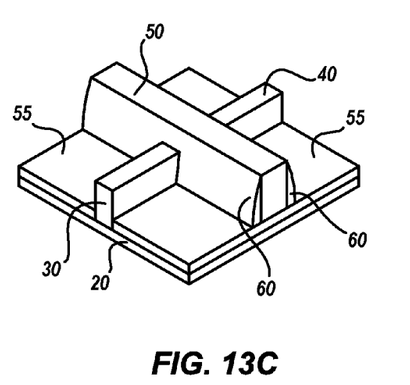

FIG. 13A and FIG. 13C depict an isometric view and FIG. 13B depicts a cross section view along plane AA of semiconductor structure 10 at intermediate stages of semiconductor device fabrication, in accordance with various embodiments of the present invention. At this stage of fabrication, replacement gate 50 is formed upon structure 10.

Replacement gate 50 may be formed upon STI regions 55 by depositing replacement gate material upon upper surface of STI regions 55 orthogonal to TFET fin and upon TFET fin 35 overlaying replacement channel 120. An optional gate dielectric, similar to gate dielectric layer 102, may also be utilized in formation of replacement gate 50.

The replacement gate 50 may be formed by depositing a conductive gate material upon the gate dielectric layer or directly upon STI regions 55 and surrounding TFET fin 35 overlaying replacement channel 120. The replacement gate 50 deposition may occur generally within and in between spacers 60. In an embodiment the upper surface of replacement gate 50 is above the upper surface of p-fin 30 and/or n-fin 40. For clarity, FIG. 13C depicts the structure 10 of FIG. 13A and of FIG. 13B without ILD 110. In an alternative embodiments, spacers 60 may be sacrificial and removed in fabrication stages e.g., associated with the removal of sacrificial gate 100 and/or sacrificial channel 95. In such embodiments, replacement spacers may be re-formed subsequent to the formation of replacement gate 50.

Though shown as a last stage of fabrication, structure 10 may undergo further fabrication steps that may add or remove materials, etc. in further front end of line, middle end of line, or back end of line fabrication steps to form a semiconductor device, such as an integrated circuit chip, processor, etc.

Figure 14:
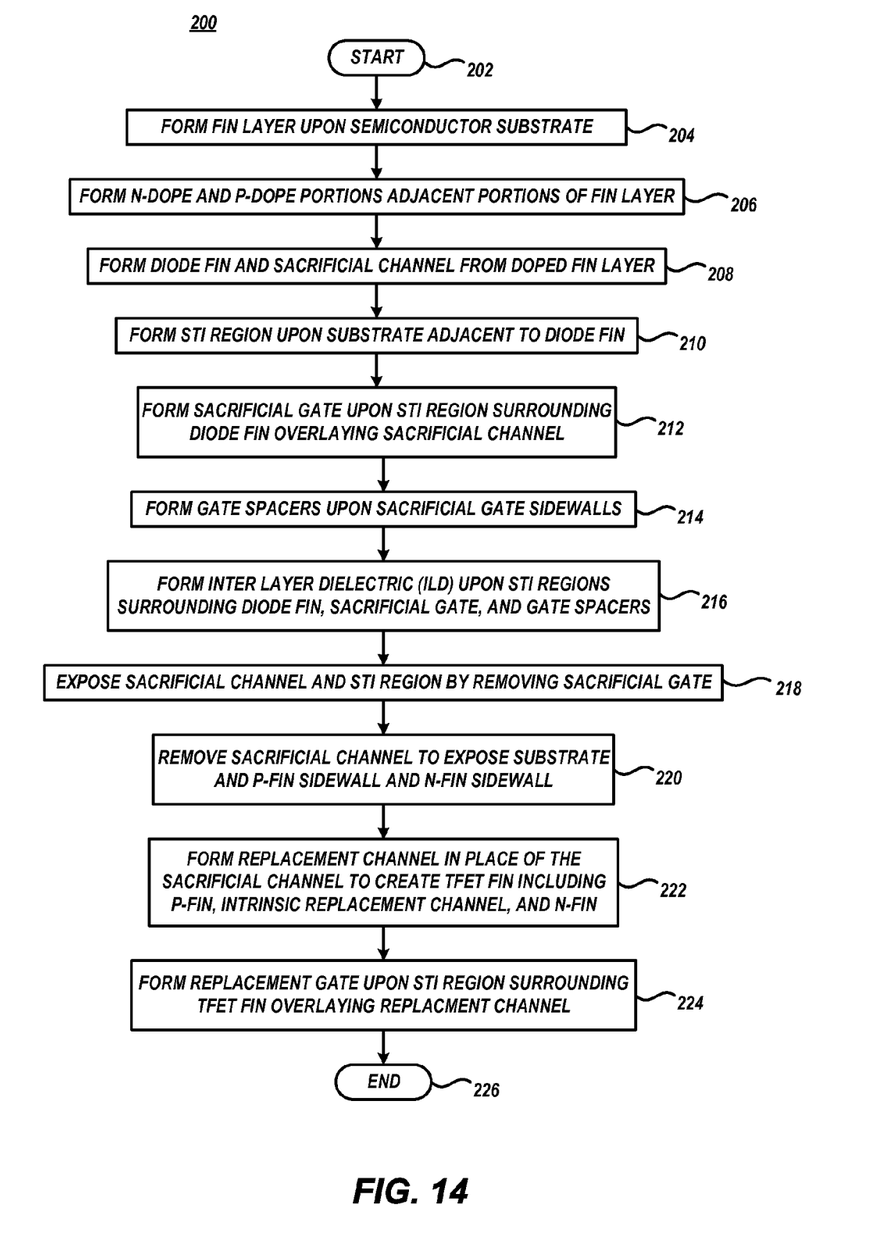
FIG. 14 depicts a semiconductor device fabrication method, in accordance with various embodiments of the present invention.

FIG. 14 depicts an exemplary process flow method 200 for fabricating a semiconductor device, in accordance with various embodiments of the present invention. Method 200 begins at block 202 and continues by forming a fin layer upon a semiconductor substrate (block 204). For example, fin layer 22 may be deposited upon substrate 20 of semiconductor structure 10. In a particular embodiment, fin layer 22 may be epitaxially grown from the upper surface of substrate 20. An exemplary depiction of semiconductor structure 10 subsequent to block 204 processes or techniques is shown in FIG. 3A and in FIG. 3B.

Method 200 may continue with forming adjacent n doped and p doped portions of the fin layer (block 206). For example, ion implantation processes 70, 80 may be utilized to implant n dopants, p dopants, respectively into fin layer 22 to form n doped portion 42 and p doped portion 32. An exemplary depiction of semiconductor structure 10 subsequent to block 206 processes or techniques is shown are FIG. 4A and in FIG. 4B.

Method 200 may continue with forming a diode fin from the doped fin layer and with forming a sacrificial channel (block 208). For example, diode fin 35 may be formed by subtractive etching processes that remove portions of doped fin layer 22 while retaining diode fin 35. Diode fin 35 includes a p-fin 30, n-fin 40, and sacrificial channel 95. Sacrificial channel 95 is diode fin 35 material centered upon p-fin 30 and n-fin 40 junction 36. An exemplary depiction of semiconductor structure 10 subsequent to block 208 processes or techniques is shown in FIG. 5A and in FIG. 5B.

Method 200 may continue with forming STI regions upon the substrate adjacent to diode fin (block 210). For example, STI region 55 may be deposited upon substrate 20 in contact with and adjacent to diode fin 35. An exemplary depiction of semiconductor structure 10 subsequent to block 210 processes or techniques is shown in FIG. 6A and in FIG. 6B.

Method 200 may continue with forming a sacrificial gate upon STI regions and upon diode fin overlaying sacrificial channel (block 212). For example, a sacrificial gate stack of various sacrificial layers (e.g., gate dielectric layer 102, gate 100, etc.) may be formed. In other implementations a single gate stack layer (e.g., gate 100) may be formed. An exemplary depiction of semiconductor structure 10 subsequent to block 212 processes or techniques is shown in FIG. 7A and in FIG. 7B.

Method 200 may continue with forming gate spacers upon the sacrificial gate stack sidewalls (block 214). For example, spacers 60 are deposited upon STI region 55, p-fin 30 or n-fin 40, respectively contacting the sidewalls of sacrificial gate 100. An exemplary depiction of semiconductor structure 10 subsequent to block 214 processes or techniques is shown in FIG. 8A and in FIG. 8B.

Method 200 may continue with forming ILD 110 upon STI regions surrounding the diode fin, sacrificial gate, and gate spacers (block 216). For example, a blanket layer may be deposited upon structure 10 and a CMP process may be utilized to expose the upper surface of the sacrificial gate stack. An exemplary depiction of semiconductor structure 10 subsequent to block 216 processes or techniques is shown in FIG. 9A and in FIG. 9B.

Method 200 may continue by exposing sacrificial channel by removing the sacrificial gate stack (block 218). For example, the sacrificial gate stack may be subtractive etched such that the sacrificial gate stack is selectively removed relative to spacers 60, sacrificial channel 95, and STI region 55. An exemplary depiction of semiconductor structure 10 subsequent to block 218 processes or techniques is shown in FIG. 10A and in FIG. 10B.

Method 200 may continue by removing the sacrificial channel to expose the underlying substrate, exposing a p-fin sidewall, and exposing an opposing n-fin sidewall (block 220). For example, the sacrificial channel 95 may be subtractive etched such that the sacrificial channel 95 is selectively removed relative to spacers 60, STI region 55, and underlying substrate 20. The removal of channel 95 forms a p-fin 30 sidewall that is coplanar with a spacer 60 sidewall and forms an opposing n-fin 40 sidewall that is coplanar a spacer 60 sidewall. An exemplary depiction of semiconductor structure 10 subsequent to block 220 processes or techniques is shown in FIG. 11A and in FIG. 11B.

Method 200 may continue by forming an intrinsic replacement channel in place of the sacrificial channel to create a TFET fin (block 222). For example, the replacement channel 120 may be deposited upon substrate 20 contacting p-fin 30 and contacting n-fin 40. In another example, the replacement channel 120 may also be epitaxially grown from the upper surface of substrate 20 exposed by the removal of sacrificial channel 95. In another example, the replacement channel 120 may be epitaxially grown from the sidewall of p-fin 30 and/or n-fin 40. The p-fin 30, the intrinsic replacement channel 120, and the n-fin 40 form a TFET fin. An exemplary depiction of semiconductor structure 10 subsequent to block 222 processes or techniques is shown in FIG. 12A and in FIG. 12B.

Method 200 may continue by forming a replacement gate upon the exposed STI regions surrounding the TFET fin overlaying the replacement channel (block 224). For example, replacement gate 50 may be formed upon STI region 55 surrounding the TFET fin overlaying replacement channel 120. An exemplary depiction of semiconductor structure 10 subsequent to block 222 processes or techniques is shown in FIG. 13A, FIG. 13B, and in FIG. 13C. Method 200 ends at block 226.

Figure 15:
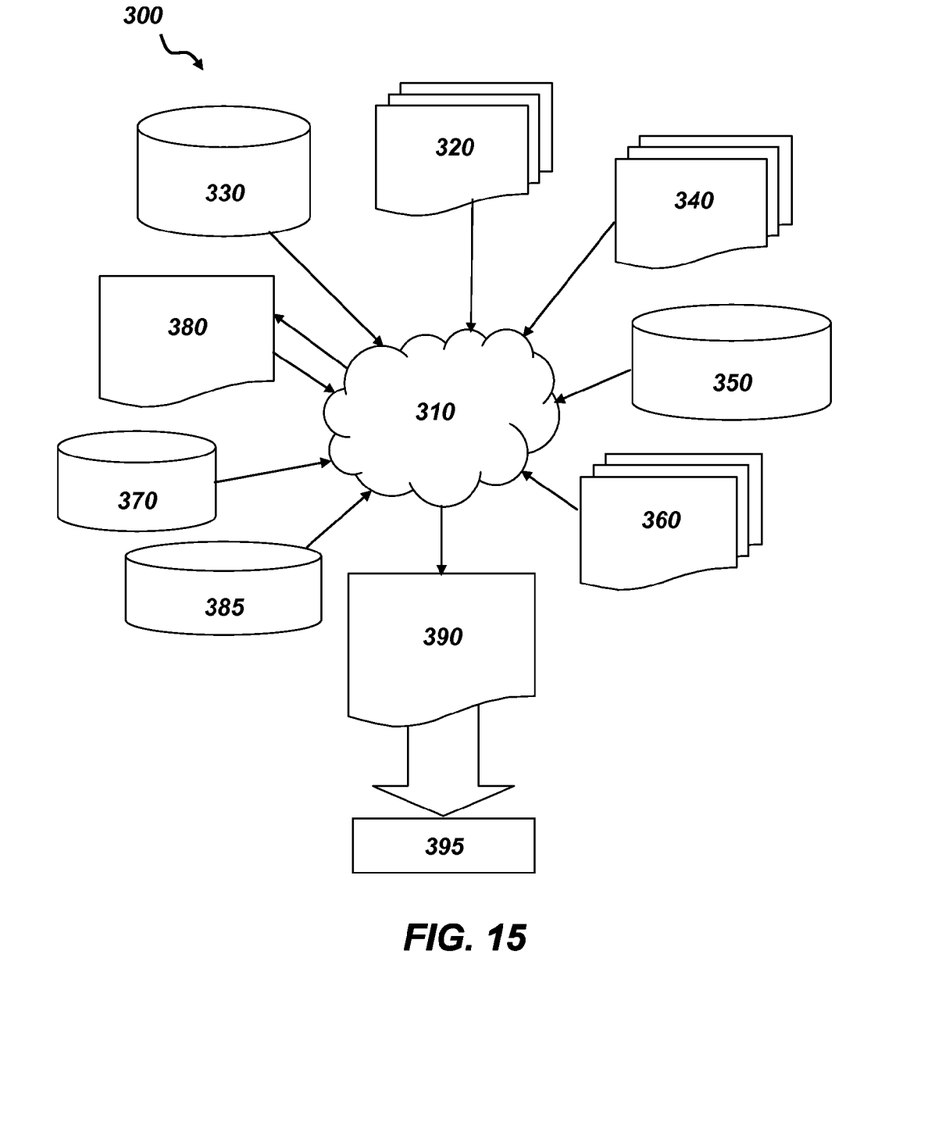
FIG. 15 depicts a flow diagram of a design process used in semiconductor design, manufacture, and/or test, in accordance with various embodiments of the present invention.

Referring now to FIG. 15, a block diagram of an exemplary design flow 300 used for example, in semiconductor integrated circuit (IC) logic design, simulation, test, layout, and/or manufacture is shown. Design flow 300 includes processes, machines and/or mechanisms for processing design structures or devices to generate logically or otherwise functionally equivalent representations of the structures and/or devices described above and shown in FIG. 1A-FIG. 13C.

The design structures processed and/or generated by design flow 300 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 300 may vary depending on the type of representation being designed. For example, a design flow 300 for building an application specific IC (ASIC) may differ from a design flow 300 for designing a standard component or from a design flow 300 for instantiating the design into a programmable array, for example a programmable gate array (PGA) or a field programmable gate array (FPGA) offered by Altera® Inc. or Xilinx® Inc.

FIG. 15 illustrates multiple such design structures including an input design structure 320 that is preferably processed by a design process 310. Design structure 320 may be a logical simulation design structure generated and processed by design process 310 to produce a logically equivalent functional representation of a hardware device. Design structure 320 may also or alternatively comprise data and/or program instructions that when processed by design process 310, generate a functional representation of the physical structure of a hardware device. Whether representing functional and/or structural design features, design structure 320 may be generated using electronic computer-aided design (ECAD) such as implemented by a core developer/designer.

When encoded on a machine-readable data transmission, gate array, or storage medium, design structure 320 may be accessed and processed by one or more hardware and/or software modules within design process 310 to simulate or otherwise functionally represent an electronic component, circuit, electronic or logic module, apparatus, device, structure, or system such as those shown in FIG. 1A-FIG. 13C. As such, design structure 320 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 310 preferably employs and incorporates hardware and/or software modules for synthesizing, translating, or otherwise processing a design/simulation functional equivalent of the components, circuits, devices, or structures shown FIG. 1A-FIG. 13C. to generate a Netlist 380 which may contain design structures such as design structure 320. Netlist 380 may comprise, for example, compiled or otherwise processed data structures representing a list of wires, discrete components, logic gates, control circuits, I/O devices, models, etc. that describes the connections to other elements and circuits in an integrated circuit design. Netlist 380 may be synthesized using an iterative process in which netlist 380 is resynthesized one or more times depending on design specifications and parameters for the device. As with other design structure types described herein, netlist 380 may be recorded on a machine-readable data storage medium or programmed into a programmable gate array. The storage medium may be a non-volatile storage medium such as a magnetic or optical disk drive, a programmable gate array, a compact flash, or other flash memory. Additionally, or in the alternative, the storage medium may be a system or cache memory, buffer space, or electrically or optically conductive devices in which data packets may be intermediately stored.

Design process 310 may include hardware and software modules for processing a variety of input data structure types including Netlist 380. Such data structure types may reside, for example, within library elements 330 and include a set of commonly used elements, circuits, and devices, including models, layouts, and symbolic representations, for a given manufacturing technology (e.g., different technology nodes, 14, 32 nm, 45 nm, 90 nm, etc.). The data structure types may further include design specifications 340, characterization data 350, verification data 360, design rules 370, and test data files 385 which may include input test patterns, output test results, and other testing information. Design process 310 may further include, for example, standard mechanical design processes such as stress analysis, thermal analysis, mechanical event simulation, process simulation for operations such as casting, molding, and die press forming, etc.

One of ordinary skill in the art of mechanical design can appreciate the extent of possible mechanical design tools and applications used in design process 310 without deviating from the scope and spirit of the invention claimed herein. Design process 310 may also include modules for performing standard circuit design processes such as timing analysis, verification, design rule checking, place and route operations, etc.

Design process 310 employs and incorporates logic and physical design tools such as HDL compilers and simulation model build tools to process design structure 320 together with some or all of the depicted supporting data structures along with any additional mechanical design or data (if applicable), to generate a second design structure 390. Design structure 390 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures).

Similar to design structure 320, design structure 390 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIG. 1A-FIG. 13C. In one embodiment, design structure 390 may comprise a compiled, executable HDL simulation model that functionally simulates the devices shown in FIG. 1A-FIG. 13C.

Design structure 390 may also employ a data format used for the exchange of layout data of integrated circuits and/or symbolic data format (e.g. information stored in a GDSII (GDS2), GL1, OASIS, map files, or any other suitable format for storing such design data structures). Design structure 390 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIG. 1A-FIG. 13C. Design structure 390 may then proceed to a stage 395 where, for example, design structure 390: proceeds to tape-out, is released to manufacturing, is released to a mask house, is sent to another design house, is sent back to the customer, etc.

The accompanying figures and this description depicted and described embodiments of the present invention, and features and components thereof. Those skilled in the art will appreciate that any particular nomenclature used in this description was merely for convenience, and thus the invention should not be limited by the specific process identified and/or implied by such nomenclature. Therefore, it is desired that the embodiments described herein be considered in all respects as illustrative, not restrictive, and that reference be made to the appended claims for determining the scope of the invention.

Unless described otherwise or in addition to that described herein, "depositing," "deposited," etc. may include any now known or later developed techniques appropriate for the material to be deposited, including, but not limited to: CVD, LPCVD, PECVD, semi-atmosphere CVD (SACVD), high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic level deposition (ALD), chemical oxidation, molecular beam epitaxy (MBE), plating or evaporation. Any references to "poly" or "poly silicon" should be understood to refer to polycrystalline silicon.

References herein to terms such as "vertical", "horizontal", etc. are made by way of example, and not by way of limitation, to establish a frame of reference. The term "horizontal" as used herein is defined as a plane parallel to the conventional plane or surface of the substrate 20, regardless of the actual spatial orientation of the semiconductor substrate 20. The term "vertical" refers to a direction perpendicular to the horizontal, as just defined. Terms, such as "on", "above", "below", "side" (as in "sidewall"), "higher", "lower", "over", "beneath" and "under", are defined with respect to the horizontal plane. It is understood that various other frames of reference may be employed for describing the present invention without departing from the spirit and scope of the present invention.

The invention claimed is:

1. A semiconductor device fabrication process comprising:
   forming a diode fin upon a semiconductor substrate, the diode fin comprising a p-fin, an n-fin, and sacrificial channel at a junction of the p-fin and the n-fin;
   forming a sacrificial gate upon the diode fin overlaying the sacrificial channel;
   removing the sacrificial gate to expose the sacrificial channel;
   removing the sacrificial channel to expose the semiconductor substrate beneath the sacrificial channel, the removal of the sacrificial channel forming a p-fin sidewall and an opposing n-fin sidewall; and
   forming an intrinsic replacement channel in place of the removed sacrificial channel.

2. The semiconductor fabrication process of claim 1, wherein the formation of the intrinsic replacement channel forms a tunneling field effect transistor (TFET) fin comprising the p-fin, the intrinsic replacement channel, and the n-fin.

3. The semiconductor device fabrication process of claim 2, further comprising:
   forming a replacement gate upon the TFET fin overlaying the intrinsic replacement channel.

4. The semiconductor device fabrication process of claim 1, wherein forming the intrinsic replacement channel further comprises:
   epitaxially growing intrinsic type III-V semiconductor material from the exposed semiconductor substrate.

5. The semiconductor device fabrication process of claim 1, wherein forming the intrinsic replacement channel further comprises:
   epitaxially growing intrinsic type III-V semiconductor material from the p-fin sidewall.

6. The semiconductor device fabrication process of claim 1, wherein forming the intrinsic replacement channel further comprises:

epitaxially growing intrinsic type III-V semiconductor material from the n-fin sidewall.

7. The semiconductor device fabrication process of claim 1, further comprising:
forming a fin layer upon the semiconductor substrate;
doping an p-portion of the fin layer; and
doping an adjacent n-portion of the fin layer.

8. The semiconductor device fabrication process of claim 7, wherein forming the diode fin further comprises:
removing portions of the doped p-portion and the doped adjacent n-portion; and
retaining distinct portions of the doped p-portion and the doped adjacent n-portion, the retained distinct portions of the doped p-portion and the doped adjacent n-portion forming the diode fin.

9. The semiconductor device fabrication process of claim 8, further comprising:
forming shallow trench isolation region(s) upon the semiconductor substrate adjacent to the diode fin.

10. The semiconductor device fabrication process of claim 9, wherein forming the sacrificial gate further comprises:
forming the sacrificial gate upon the STI region(s).

11. The semiconductor device fabrication process of claim 10, further comprising:
forming gate spacers upon sidewalls of the sacrificial gate.

12. The semiconductor device fabrication process of claim 11, wherein removing the sacrificial gate further comprises:
removing the sacrificial gate between the gate spacers to expose the STI region(s).

13. The semiconductor device fabrication process of claim 7, wherein forming the fin layer further comprises:
epitaxially growing an intrinsic type III-V semiconductor material from an upper surface of the semiconductor substrate.

14. A semiconductor device comprising:
a tunneling field effect transistor (TFET) fin upon a semiconductor substrate, the TFET fin comprising:
a p-fin;
a n-fin; and
an intrinsic replacement channel aligned with and contacting the p-fin and the n-fin, the intrinsic replacement channel directly contacting the semiconductor substrate; and
a replacement gate formed directly on and contacting the intrinsic replacement channel, the replacement gate formed from a conductive gate material.

15. The semiconductor device of claim 14, wherein the TFET fin is formed from a diode fin comprising the p-fin, the n-fin, and a sacrificial channel at a junction of the p-fin and the n-fin.

16. The semiconductor device of claim 15, wherein the intrinsic replacement channel takes the place of the sacrificial channel.

17. A semiconductor device fabrication process comprising:
providing a bulk semiconductor substrate;
epitaxially growing a fin layer from an upper surface of the bulk semiconductor substrate;
p-doping a portion of the fin layer and n-doping an adjacent portion of the fin layer;
forming a diode fin by removing sections of the p-doped portion and removing sections of the n-doped adjacent portion, the diode fin comprising:
a p-fin;
an n-fin; and
a sacrificial channel at a junction of the p-fin and the n-fin; and
forming a tunneling field effect transistor (TFET) fin by:
removing the sacrificial channel to expose a portion of the upper surface of the bulk semiconductor substrate beneath the sacrificial channel; and
forming an intrinsic replacement channel in place of the removed sacrificial channel.

18. The semiconductor device fabrication process of claim 17, further comprising:
forming shallow trench isolation (STI) regions(s) upon the bulk semiconductor substrate adjacent to the diode fin.

19. The semiconductor device fabrication process of claim 18, further comprising:
forming a sacrificial gate upon the STI region(s) and upon the diode fin overlaying the sacrificial channel.

20. The semiconductor device fabrication process of claim 19, further comprising:
exposing the sacrificial channel by removing the sacrificial gate.

* * * * *